United States Patent [19]

Yamamura et al.

[11] Patent Number: 4,949,224
[45] Date of Patent: Aug. 14, 1990

[54] STRUCTURE FOR MOUNTING A SEMICONDUCTOR DEVICE

[75] Inventors: Keiji Yamamura, Sakurai; Hirokazu Yoshida, Osaka, both of Japan

[73] Assignee: Sharp Kabushiki Kaisha, Osaka, Japan

[21] Appl. No.: 233,843

[22] Filed: Aug. 16, 1988

Related U.S. Application Data

[63] Continuation of Ser. No. 131,262, Dec. 9, 1987, abandoned, which is a continuation of Ser. No. 905,850, Sep. 10, 1986, abandoned.

[30] Foreign Application Priority Data

Sep. 20, 1985 [JP] Japan ................................ 60-209085
Sep. 20, 1985 [JP] Japan ................................ 60-209086

[51] Int. Cl.$^5$ .......................................... H05K 1/14
[52] U.S. Cl. ...................................... 361/412; 361/398; 439/69
[58] Field of Search ............... 361/398, 421, 400, 404, 361/405, 412, 413; 174/52.4; 357/70, 71, 80; 439/65, 69, 67, 71, 72

[56] References Cited

U.S. PATENT DOCUMENTS

| | | | |
|---|---|---|---|
| 3,628,105 | 12/1971 | Sakai et al. | 357/70 X |
| 3,683,105 | 8/1972 | Shamash et al. | 361/398 X |
| 3,684,818 | 8/1972 | Netherwood | 361/398 X |
| 3,686,612 | 8/1972 | Clements | 439/71 X |
| 3,832,769 | 9/1974 | Olyphant Jr. | 361/398 X |
| 3,868,724 | 2/1975 | Perrino | 357/70 X |
| 3,936,928 | 2/1976 | Hopp | 174/52.4 X |
| 3,967,162 | 6/1976 | Ceresa et al. | 361/398 |
| 4,042,861 | 8/1977 | Yasuda et al. | 439/67 X |
| 4,064,552 | 12/1977 | Angelucci et al. | 361/398 X |
| 4,360,858 | 11/1982 | Fahling | 361/398 X |
| 4,480,288 | 10/1984 | Gazdik et al. | 361/398 |
| 4,481,559 | 11/1984 | Buck et al. | 361/398 X |
| 4,541,003 | 9/1985 | Otsuka et al. | 361/421 X |
| 4,651,416 | 3/1987 | Depaul | 439/69 X |

FOREIGN PATENT DOCUMENTS 56-16356 12/1981 Japan ...................... 357/70

OTHER PUBLICATIONS

Matin et al., Hermetic Hybrid Module, IBM Tech. Disc. Bull., V. 21 #10 Mar. 1979, pp. 4023 and 4024.
William H. C. Hui, Integration Techniques For Electronically Active Elements and Circuits, RCA Tech. Notes, Jul. 1967.

*Primary Examiner*—Gerald P. Tolin
*Attorney, Agent, or Firm*—Flehr, Hohbach, Test, Albritton & Herbert

[57] ABSTRACT

Semiconductor devices are mounted to a circuit board three-dimensionally by using a tape carrier film with device-connecting electrodes formed on both sides. Bump electrodes are formed on the devices and they are connected individually to these device-connecting electrodes each of which is connected to one of terminal electrodes on the circuit board. The film has through-hole conductors at places to electrically connect bump electrodes on opposite sides of the film.

18 Claims, 6 Drawing Sheets

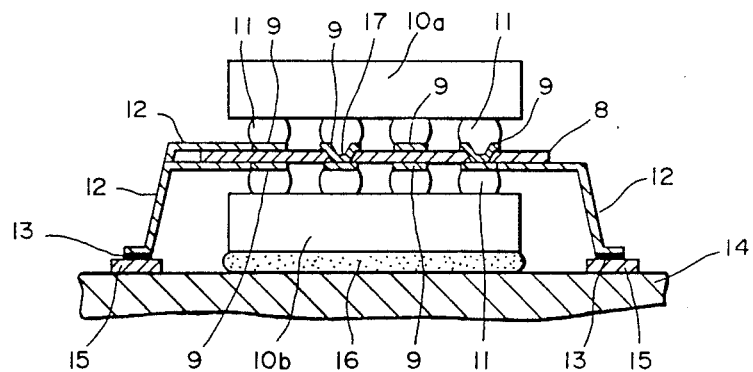
FIG.—1
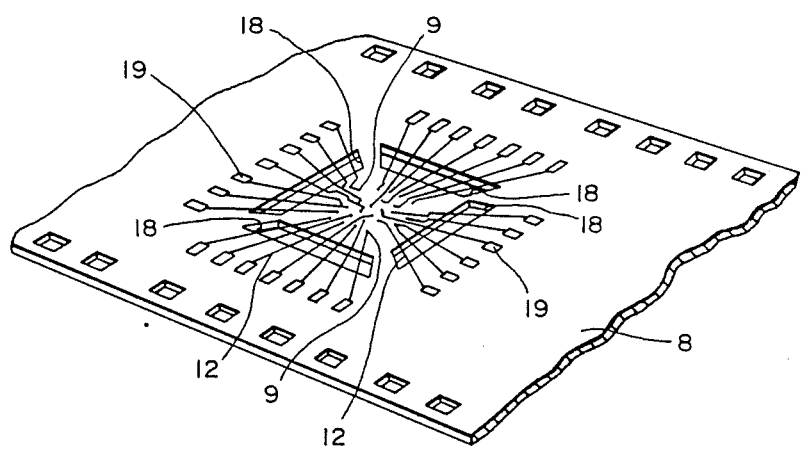
FIG.—2
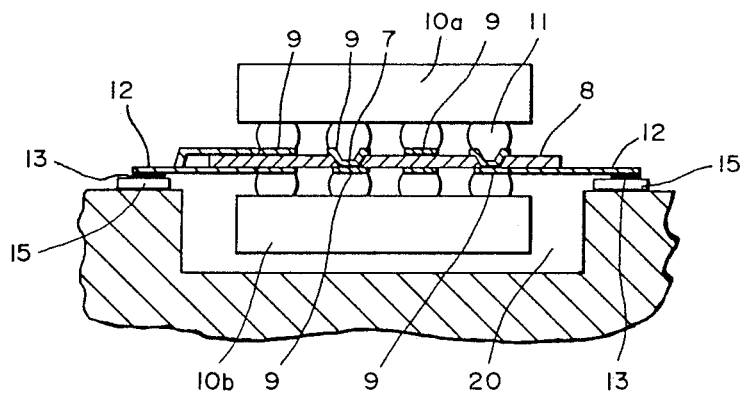
FIG.—3

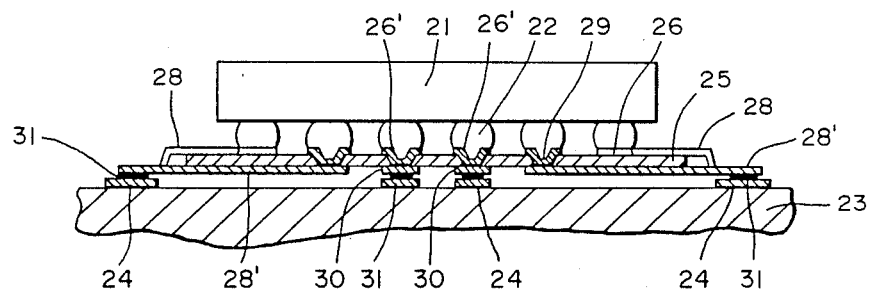
FIG.—4
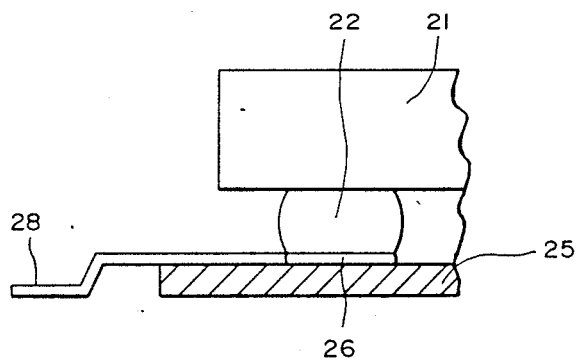
FIG.—5
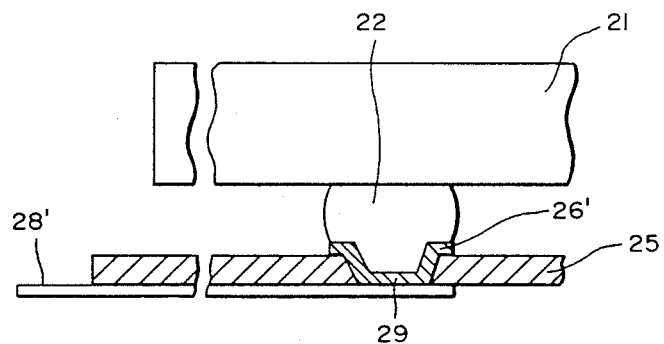
FIG.—6

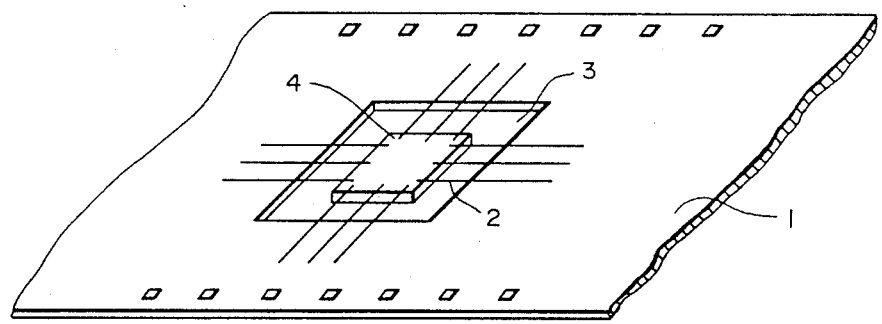
FIG.—7A (PRIOR ART)
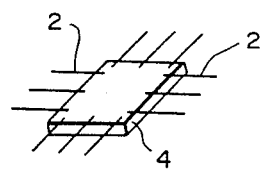
FIG.—7B
(PRIOR ART)
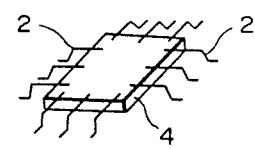
FIG.—7C
(PRIOR ART)
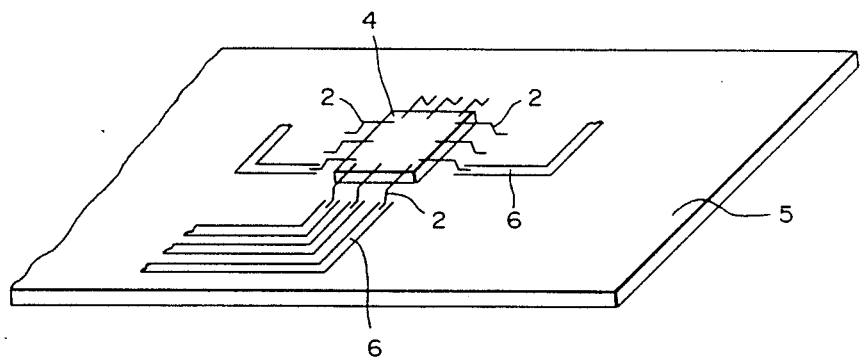
FIG.—7D (PRIOR ART)

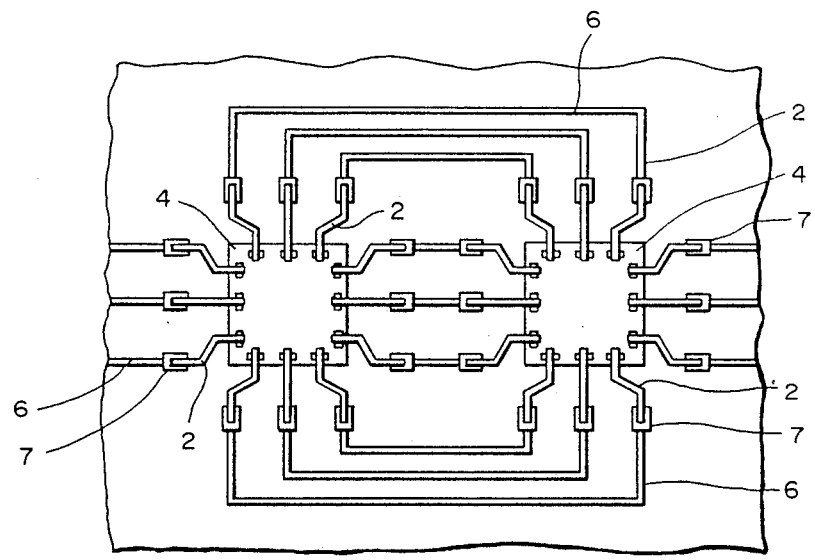
FIG.—8 (PRIOR ART)
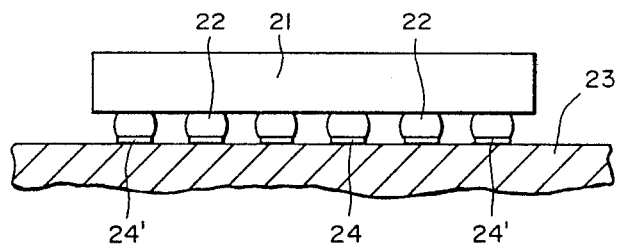
FIG.—9 (PRIOR ART)
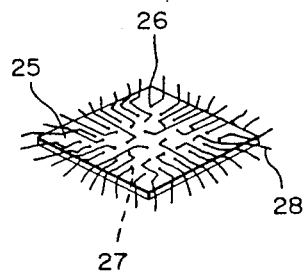
FIG.—10B (PRIOR ART)

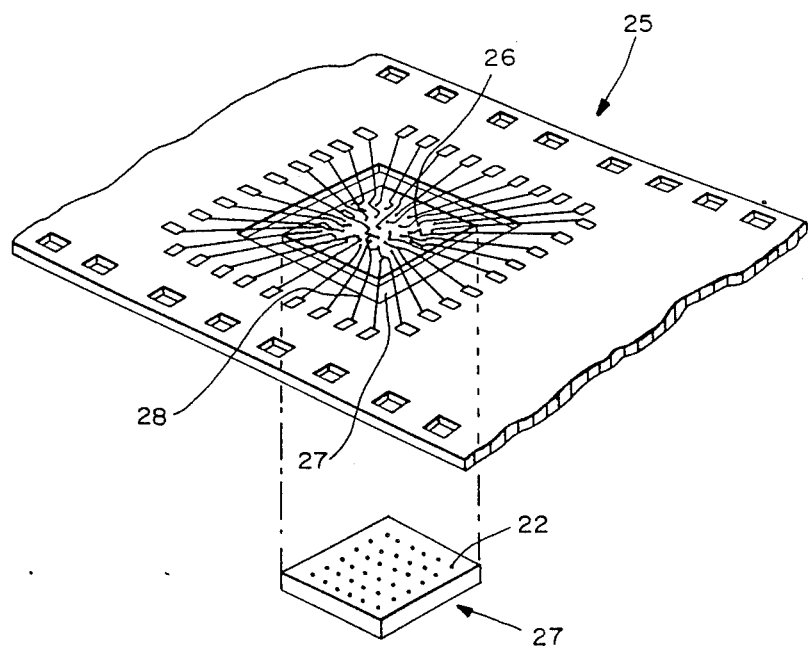
FIG.—10A (PRIOR ART)
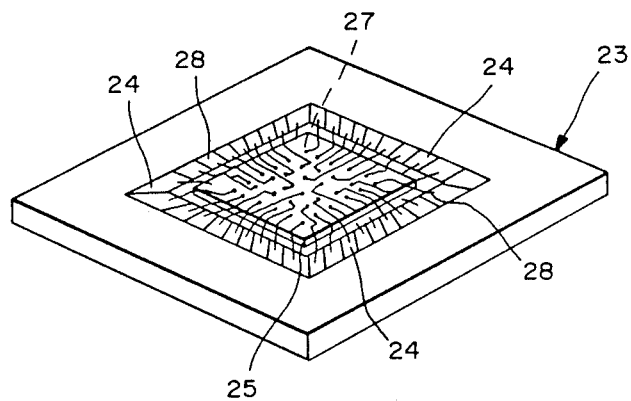
FIG.—10C (PRIOR ART)

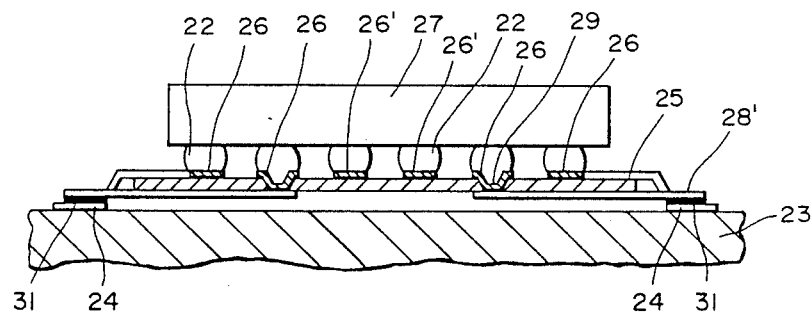
FIG. — 11 (PRIOR ART)
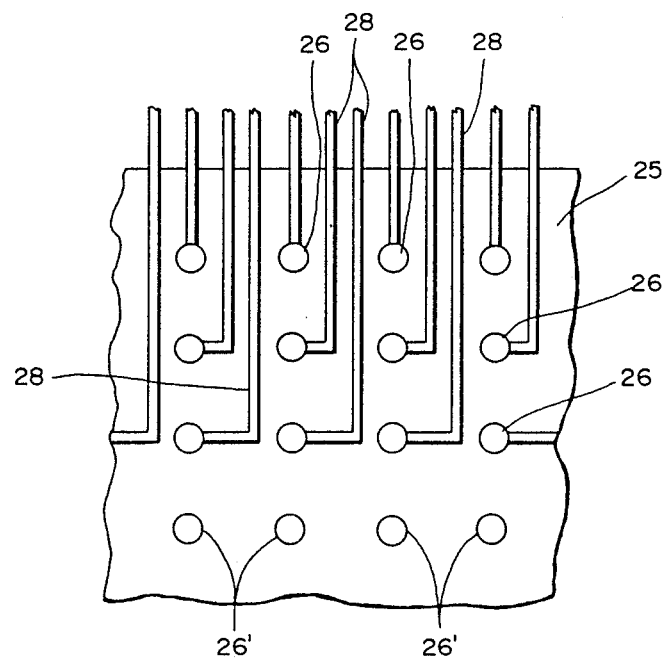
FIG. — 12 (PRIOR ART)

STRUCTURE FOR MOUNTING A SEMICONDUCTOR DEVICE

This is a continuation of application Ser. No. 131,262 filed Dec. 9, 1987 now abandoned which is a continuation of application Ser. No. 905,850 filed Sept. 10, 1986 now abandoned.

BACKGROUND OF THE INVENTION

This invention relates to a structure for mounting a semiconductor device to a circuit board by using a tape carrier film and also to a structure for mounting a flip chip having bump electrodes on its surface to a circuit board to electrically connect them through a tape carrier film.

When a plurality of integrated circuits are combined and driven as a system, the individual IC chips are separately packaged and these packages are then electrically connected to a circuit board. This conventional method of mounting is not effective for reducing the size of electronic devices because the density of mounted devices cannot be increased beyond a certain limit if the devices are already packaged individually. If the density of mounted devices cannot be increased, furthermore, the lengths of wires connecting them cannot be reduced beyond a certain limit and this affects the performance characteristics of the system adversely.

In view of the above, the so-called multi-chip package, wherein a plurality of devices are mounted within a single package, has come to be considered in recent years as an effective method of overcoming these difficulties. Some of the already considered methods of mounting a plurality of devices in a multi-chip package are the wire bonding method, the flip chip method and the film carrier method. Of the above, the most effective seems to be the film carrier method which is a type of the so-called gang bonding method whereby a plurality of electrodes are bonded at once. This method is also preferable because it is suited for mass production of these devices.

To describe the film carrier method by way of FIG. 7-A, outer leads 2 which are designed to correspond to the pads of an IC are preliminarily formed on a tape carrier film 1 such that they extend into an opening 3 of a generally square shape. A semiconductor device 4 cut out from a wafer is placed in this opening 3 and each of these outer leads 2 is electrically connected to the device 4 by inner lead bonding. Thereafter, the outer leads 2 are cut off as shown in FIG. 7-B and the device 4 is removed from the tape carrier film 1. Each outer lead 2 may be bent as shown in FIG. 7-C, if necessary, and then electrically connected as shown in FIG. 7-D to a wiring pattern 6 formed on a circuit board 5.

When a plurality of semiconductor devices are connected by the aforementioned film carrier method for mounting to a circuit board in a multi-chip package, the devices are distributed two-dimensionally, or in a plane, as shown in FIG. 8 with the ends of their outer leads 2 connected to terminal electrodes 7 of the wiring pattern 6 on the circuit board 5. Accordingly, there must be reserved on the circuit board 5 an area which corresponds to the number of the semiconductor devices 4 to be mounted thereon. Although the circuit board 5 can be made smaller by this method than if individually packaged devices were mounted, the overall size of the package cannot be reduced by this method beyond a certain limit. Moreover, since the wiring pattern 6 for connecting the devices 4 must be formed according to the positions of the devices 4 within the package, failure to reduce the size of the circuit board means adverse effects on the device characteristics such as delay in transmission and cross talk especially in the case of semiconductor devices of a high-speed response type.

In view of the above, flip chips are considered favorable because not only can a flip chip be mounted by means of bumps formed on active areas but electrodes (bumps) can be pulled out freely from any desired positions. Thus, the flip chip enjoys a large degree of freedom in its design and since bumps can be formed all over its surface, it is particularly suited for multi-terminal connection. Moreover, since the flip chip, unlike the wire bonding method, does not require a special area for connection, chips can be made smaller and the production cost can be reduced and this makes the flip chip method even more attractive for the mounting of high-speed devices. According to a general method illustrated in FIG. 9 of attaching a flip chip, however, bumps 22 which are formed by soldering on the surface of a chip 21 are directly soldered onto terminal electrodes 24, 24' etc. of the circuit board 23 of a package. For this reason, the chip 21 becomes heated and the general temperature changes in the environment cause distortion between the chip 21 and the circuit board 23 due to their difference in thermal expansion. This is particularly serious near the periphery of the chip 21 because connections between the bumps 22 and terminal electrodes 24' in this region are very easily breakable.

Use of ceramic materials such as silicon carbide and aluminum nitride with coefficients of thermal expansion nearly equal to that of the chip 21, or silicon, has been considered for the circuit board such that the adverse effects of the difference in thermal expansion can be made negligible, but since this method is expensive and involves electrical problems, it has not been considered practicable. Another way to obviate the problems described above is to use the so-called area tape automated bonding (area TAB) method according to which the flip chip 21 is not directly mounted on the circuit board 23 but is bonded first to a tape carrier film of a flexible film-like material and then mounted to the circuit board 23 through this film. To explain this method in detail by way of FIG. 10, pads 26 are preliminarily prepared on a tape carrier film 25 corresponding to the positions of bumps 22 on the flip chip 21 and each bump 22 of the flip chip 21 which is cut off from a wafer is connected by bonding to a pad 26 on the tape carrier film 25. Thereafter, leads 28 extending radially from the pads 6 to make connections across a square-shaped opening 27 are cut along its edges as shown in FIG. 10-B and the flip chip 21 to which the tape carrier film 25 is attached is connected as shown in FIG. 10-C by connecting each lead 28 to a terminal electrode 24 on the circuit board 23. If this mounting method is used, the flexible tape carrier film 25, which is sandwiched between the flip chip 21 and the circuit board 23, can absorb the distortion caused by the difference in thermal expandion between the chip 21 and the circuit board 23 such that a highly reliable product can be obtained. The tape carrier method is also adapted for mass production.

Although the tape carrier method is generally effective as described above, each electric signal from the flip chip 21 must be transmitted first through the wiring on the tape carrier film 25 to a lead 28 around a pad 26 on the film 25 and then to a desired circuit on the circuit board 23 through this lead 28. If there are very many bumps 22 provided all over the surface of the flip chip 21 as is often the case as shown, for example, in FIG. 10-A, it becomes impossible to take out all signals from the chip. Even if leads 28' are additionally provided as shown in FIG. 11 on the opposite side of the tape carrier film 25 and are each electrically connected to a pad 26 through a throughhole 29, the number of internally located pads from which signals can be extracted is limited, as shown in FIG. 12, by the number of lead lines 28 which can pass between two mutually adjacent pads 26 adjacent to the periphery. When there are very many pads and hence many pads at inner locations, therefore, signals cannot be taken out from some of the inner pads 26'.

SUMMARY OF THE INVENTION

It is therefore an object of the present invention in view of the above to provide a structure for mounting a number of semiconductor devices on a circuit board without adversely affecting the characteristics of the individual devices.

It is another object of the present invention to provide a structure for mounting a large number of semiconductor devices on a circuit board at a high density by using a tape carrier film.

It is a further object of the present invention to provide a structure for mounting a flip chip with a large number of bumps at high density all over its surface.

It is still another object of the present invention to provide a structure for mounting a flip ship with a large number of bumps by using a tape carrier film.

The above and other objects of the invention are achieved by mounting semiconductor devices on a circuit board three-dimensionally by using a tape carrier film with device-connecting electrodes formed on both sides. Bump electrodes are formed on the devices and they are connected individually to these device-connecting electrodes. Each device-connecting electrode is electrically connected to a terminal electrode formed on the circuit board. The film has throughhole conductors at places to electrically connect bump electrodes on opposite sides of the film.

In another aspect of the present invention, a flip chip with many bump electrodes on a surface is mounted on a circuit board by using a tape carrier film inbetween to absorb their difference in thermal expansion. Bump electrodes near the center, where the effects of difference in thermal expansion are relatively small, are connected through throughholes directly to terminal electrodes on the circuit board. Those near the periphery, where the effects of difference in thermal expansion are large, are connected to terminal electrodes through flexible lead lines.

BRIEF DESCRIPTION OF THE DRAWINGS

The accompanying drawings, which are incorporated in and form a part of the specification, illustrate embodiments of the present invention and, together with the description, serve to explain the principles of the invention. In the drawings:

FIG. 1 is a front sectional view of a mounting structure for semiconductor devices according to one embodiment of the present invention, FIG. 2 is a perspective view of a portion of tape carrier film used in the mounting structure shown in FIG. 1, FIG. 3 is a front sectional view of a mounting structure according to another embodiment of the present invention, FIG. 4 is a front sectional view of a mounting structure for a flip chip according to one embodiment of the present invention, FIG. 5 is an enlarged front sectional view of a portion of the mounting structure of FIG. 4, FIG. 6 is an enlarged front sectional view of another part of the mounting structure of FIG. 4, FIGS. 7A-7D shows a previously considered process of mounting semiconductor devices by a film carrier method, FIG. 8 is a plan view of a mounting structure according to a previously considered film carrier method, FIG. 9 is a front view of a previously considered mounting structure for a flip chip without using a tape carrier film, FIGS. 10A-10C shows a previously considered process of mounting a tape carrier film to a flip chip, FIG. 11 is a front sectional view of a previously considered mounting structure, and FIG. 12 is a plan view of a previously considered mounting structure.

DETAILED DESCRIPTION OF THE INVENTION

According to one embodiment of the invention illustrated in FIG. 1, a tape carrier film 8 is provided with electrodes 9 on both surfaces. These electrodes are for making connections with devices and each include a bonding pad. Two semiconductor devices 10a and 10b are disposed on opposite sides of the film 8 so as to sandwich it therebetween. Protruding electrodes (bumps) 11 are formed by soldering on the surfaces of these devices 10a and 10b corresponding to the pads on a flip chip device. These bumps 11 are electrically connected by bonding individually to the electrodes 9 such that the two semiconductor devices 10a and 10b are connected through the tape carrier film 8. The bumps are shaped so as to minimize the stress experienced by the devices 10a and 10b and the film 8 when they are bonded. A plurality of lead lines 12 are electrically connected to the individual device-connecting electrodes 9 on both sides of the film 8 and are bent downward such that their ends are electrically connected to terminal electrodes 15 on a circuit board 14 by a soldering substance 13 with melting point below that of the bump 11. Both the leads 12 and the device-connecting electrodes 9 are made of copper and 10–35 μm in thickness. In order to improve the adhesiveness to the soldering substance 13 when the connection is made, their surfaces are plated with tin or gold. A die bond material 16 for radiating heat may be provided between the lower device 10b and the circuit board 14, depending on how much heat is generated by the devices 10a and 10b. If the rate of heat generation is sufficiently low, this can be omitted. The film 8 is also provided with throughhole conductors 17 at places where electrical connection is required between the mutually corresponding electrodes 9 on the opposite sides of the film 8 such that the corresponding bumps 11 of the devices 10a and 10b can be connected together.

With reference next to FIG. 2, the film 8 is not provided with a square-shaped opening of the type shown in FIG. 7-A. Instead, it is provided with four elongated openings 18 as shown to form a disconnected quadrangular shape. The device-connecting electrodes 9 are distributed on the area surrounded by these elongated openings 18 and the leads 12 are laid out radially from these electrodes 9, each across one of these elongated openings 18 to one of test electrodes 19. In short, since there is no square-shaped opening in the middle of the film 8, the electrodes 9 according to the present invention can be formed at any positions on the film 8 by bonding and, accordingly, the bumps 11 can be formed at any positions on the devices 10a and 10b. After the devices 10a and 10b are attached by connecting the bumps 11 to the electrodes 9 by bonding, the leads 12 are cut along the openings 18 and the portion of the film sandwiched between the devices is cut out.

The mounting structure thus completed according to the present invention is characterized as being three-dimensional, with the devices 10a and 10b sandwiching the tape carrier film 8 in a layered formation. As a result, less than one-half of the area required by earlier mounting structures will be needed according to the present invention. If the areas needed for mounting on the devices 10a and 10b can thus be reduced, the wires connecting them together can be shortened. When the devices 10a and 10b are used in combination, therefore, their individual characteristics are less likely to be affected adversely.

FIG. 3 shows a mounting structure according to another embodiment of the present invention characterized as having an indentation 20 formed in the circuit board 14' such that the lower device 10b can be placed therein. According to this embodiment, the leads 12 and the terminal electrodes 15 on the circuit board 14' can be positioned at approximately the same height such that the need to bend the leads 12 is obviated.

To summarize the advantages of the present invention, the area needed for mounting devices on a circuit board can be significantly (less than one-half) reduced such that miniaturized electronic devices can be easily realized. With the area for mounting thus reduced, the lengths of connecting wires can be reduced and many devices can be mounted without adversely affecting their individual characteristics. The method of the present invention described above is particularly effective for constructing a compound module containing different types of semiconductor devices. The advantage of film carrier method that it is particularly suited for mass production remains directly available.

FIG. 4 is a front sectional view of a structure for mounting a flip chip according to another aspect of the present invention. Since the structure shown in FIG. 4 is a result of an attempt to improve the type of previously considered structure depicted in FIG. 11, numerals defined above by way of FIG. 11 will be used again to indicate identical or equivalent components.

The structure shown in FIG. 4 is distinguished from that shown in FIG. 11 firstly in that pads 30 are provided on the side of the tape carrier film 25 distal to the flip chip 21 and at positions corresponding to the pads 26' for connecting bumps 22 near the center part of the flip chip 21. Each of these pads 26' is electrically connected to a corresponding pad 30 through a throughhole 29. Secondly, there are provided terminal electrodes 24 additionally at places on the circuit board 23 corresponding to the aforementioned pads 30 for making connections to the circuit board.

The flip chip 21 may be provided with a large number of bumps 22 in matrix formation and the pads 26 and 26' are formed on one side of the film 25 at corresponding positions. The film 25 may be made of an insulative material such as polyimide, glass epoxy and polyester. Its thickness is preferably about 25–127μm. The pads 26, 26' and 30 and the leads 28 and 28' are mainly copper and have thickness of about 10–35 μm. Their surfaces may be plated with tin or gold to improve adhesion to the solder material. A solder material with melting point lower than that of the bumps 22 is used for the connection of the leads 28 and 28' and the pads 30 with the terminal electrodes 24 on the circuit board 23.

A pad 26 connected to a bump 22 near the periphery of the flip chip 21 is connected to a lead 28 on one side of the film 25 as shown in FIG. 5 and also to another lead 28' on the opposite (distal) side of the film 25 as shown in FIG. 6. A pad 26' for connecting to a bump which is near the center of the flip chip and from which signals cannot be taken out to the peripheral region is directly connect to a terminal electrode 24 on the circuit board 23 through a throughhole 29 and a connecting pad 30 on the lower surface of the film 25.

With a construction as described above by way of FIGS. 4, 5 and 6, the distortion caused by the difference in thermal expansion between the flip chip 21 and the circuit board 23 is relatively small near the center and the pads 26' in this area, which are therefore more reliable, are directly connected to a terminal electrode 24 on the circuit board 23 through a throughhole 29 and a connecting pad 30. Near the periphery, on the other hand, the distortion due to the difference in thermal expansion is relatively large and bumps 22 near the periphery of the flip chip 21 are connected to a terminal electrode 24 through the flexible tape carrier film 25 and by equally flexible leads 28 and 28'.

In summary, a flip chip having a large number of bumps formed at high density can be reliably connected to a circuit board according to the present invention such that many terminals can be drawn from a single device. With a mounting structure of this invention, LSIs can be more effectively miniaturized and an increased number of pins can be accommodated.

The foregoing description of preferred embodiments of the invention has been presented for purposes of illustration and description. It is not intended to be exhaustive or to limit the invention to the precise form disclosed, and many modifications and variations are possible in light of the above teaching. Such modifications and variations which may be apparent to a person skilled in the art are intended to be within the scope of this invention.

What is claimed is:

1. A structure mounting a flip chip to a circuit board, said flip chip having on a surface thereof a plurality of bump electrodes including peripheral bumps and central bumps, said peripheral bumps being in peripheral regions of said surface and including at least those of said bump electrodes abutting peripheries of said surface, said central bumps being in non-peripheral regions of said surface and surrounded by said peripheral bumps, said circuit board having thereon peripheral and central terminal electrodes, said central terminal electrodes being opposite said non-peripherial regions and being connected to said central bumps, said structure comprising a tape carrier film between said flip chip and said circuit board, said tape carrier film having a first surface opposite said flip chip, a second surface opposite said circuit board and a plurality of throughholes therethrough, bump-connecting pads which are provided on said first surface of said tape carrier film and connected individually to said bump electrodes, board-connecting pads which are provided on said second surface of said tape carrier film and connected individually to those of bump-connecting pads individually connected to one of said central bumps through one of said throughholes and to one of said central terminal electrodes, leads of first kind in part on said first surface of said tape carrier film, each serving to electrically connect one of said peripheral terminal electrodes with one of said bump-connecting pads connected individually to one of said peripheral bumps, and leads of second kind in part on said second surface of said tape carrier film, each serving to electrically connect one of said peripheral terminal electrodes with one of said peripheral bumps through one of said throughholes and through one of said bump-connecting pads.

2. The structure of claim 1 wherein said tape carrier film is insulative.

3. The structure of claim 2 wherein said tape carrier film comprises polyimide.

4. The structure of claim 2 wherein said tape carrier film comprises glass epoxy.

5. The structure of claim 2 wherein said tape carrier film comprises polyester.

6. The structure of claim 1 wherein said tape carrier film is 25–127 μm in thickness.

7. The structure of claim 1 wherein said leads are attached to said terminal electrodes and to said board-connecting pads by a soldering material having a melting point lower than that of said bump electrodes.

8. The structure of claim 1 wherein said bump-connecting pads and leads comprise copper and are 10–30 μm in thickness.

9. The structure of claim 1 wherein said leads are flexible.

10. A structure mounting two semiconductor devices to a circuit board, each of said devices having on a surface thereof a plurality of bump electrodes including peripheral bumps and central bumps, said peripheral bumps being in peripheral regions of said surface and including at least those of said bump electrodes abutting peripheries of said surface, said central bumps being in non-peripheral regions of said surface and surrounded by said peripheral bumps, said circuit board having thereon a plurality of terminal electrodes, said structure comprising a tape carrier film disposed substantially parallel to said circuit board and sandwiched between said two devices which are disposed opposite to each other thereacross, said film having a plurality of throughholes therethrough, bump-connecting pads attached on both sides of said tape carrier film, each connected to one of said bumps, leads in part on at least one side of said tape carrier film, connecting said peripheral bumps to said terminal electrodes, said leads further connecting to said circuit board terminal electrodes, and throughhole conductors each disposed through one of said throughholes to electrically connect said central bumps across said tape carrier film.

11. The structre of claim 10 wherein said tape carrier film is insulative.

12. The structure of claim 11 wherein said tape carrier film comprises polyimide.

13. The structure of claim 11 wherein said tape carrier film comprises glass epoxy.

14. The structure of claim 11 wherein said tape carrier film comprises polyester.

15. The structure of claim 10 wherein said tape carrier film is 25–127 μm in thickness.

16. The structure of claim 10 wherein said leads are attached to said terminal electrodes and to said bumps by a soldering material having a melting point lower than that of said bump electrodes.

17. The structure of claim 10 wherein said bump-connecting pads and leads comprise copper and are 10–35 μm in thickness.

18. The structure of claim 10 wherein said leads are flexible.

* * * * *